United States Patent [19]
Mille et al.

[11] Patent Number: 5,349,232
[45] Date of Patent: Sep. 20, 1994

[54] PROTECTION DIODE FOR A VERTICAL SEMICONDUCTOR COMPONENT

[75] Inventors: Jacques Mille; Philippe Meunier, both of Aix-en-Provence, France

[73] Assignee: SGS-Thomson Microelectronics S.A., Saint-Genis Pouilly, France

[21] Appl. No.: 85,310

[22] Filed: Jun. 29, 1993

[30] Foreign Application Priority Data

Jun. 30, 1992 [FR] France ............... 92 08483

[51] Int. Cl.⁵ .................. H01L 23/60; H01L 23/62; H01L 29/90
[52] U.S. Cl. .................. 257/603; 257/173; 257/355; 257/139
[58] Field of Search ........... 257/603, 484, 481, 355, 257/173, 139

[56] References Cited
U.S. PATENT DOCUMENTS

| | | | |
|---|---|---|---|
| 4,051,504 | 9/1977 | Hile ............ | 257/603 |
| 4,792,840 | 12/1988 | Nadd ............ | 257/528 |
| 5,053,743 | 10/1991 | Mille et al. ....... | 257/528 |

FOREIGN PATENT DOCUMENTS 0236200  9/1987  European Pat. Off. .

*Primary Examiner*—Rolf Hille
*Assistant Examiner*—Wael Fahmy
*Attorney, Agent, or Firm*—Wolf, Greenfield & Sacks

[57] ABSTRACT

A high voltage avalanche diode formed in an integrated circuit includes vertical power components. The integrated circuit is formed in an N-type semiconductor substrate. The rear surface of the substrate corresponds to a first main electrode of the power components, whose second main electrodes correspond to regions formed in P-type wells which are formed in the front surface of the substrate. The diode includes a P-type region wound substantially as a spiral that is formed in the front surface of the substrate; non-overlapping N-type regions formed in equal number in each turn of the spiral and forming with the spiral elemental avalanche diodes; metallizations connecting in series the elemental diodes; and a connection between an end of the spiral and the first electrode.

13 Claims, 4 Drawing Sheets

PROTECTION DIODE FOR A VERTICAL SEMICONDUCTOR COMPONENT

BACKGROUND OF THE INVENTION

1. Field of the Invention

The present invention relates to high voltage vertical power transistors that are devices vertically formed on a silicon wafer (usually comprising an N-type epitaxial layer on an N+ substrate), the rear surface of which is connected to a high voltage. The invention relates to vertical power transistors of the MOS, bipolar or insulated-gate type, and more particularly relates to smart power switches that are circuits including, on a single silicon chip, vertical power components and logic circuits for controlling the power components.

2. Discussion of the Related Art

Power transistors are designed to withstand a definite forward voltage (for example 400 volts). If the external circuit applies a higher voltage, a damaging breakdown mode may occur. For example, the switching of an inductive load causes an overvoltage having a predetermined amount of energy that needs be dissipated. This overvoltage is applied onto the power switch which is off. One of the solutions to protect the device is to briefly set it in the conductive state for the time required to allow the excessive energy to flow through the device.

Therefore, it has been suggested to provide a device such as an avalanche diode that is set to a conductive state for a value slightly lower than the breakdown voltage of one or several power transistors, for example, to trigger the conductive state of such transistors before they reach their breakdown threshold, thus avoiding any damage.

FIG. 1, useful for understanding the problem that the invention aims to solve, is a cross-sectional view of a cell of an exemplary conventional dual structure including a vertical diffused power MOS (VDMOS) transistor TP. The VDMOS transistor is connected to logic circuits, an N-channel MOS transistor TL of which is schematically illustrated.

The structure is formed in a substrate 11 of a first conductivity type, for example of the N-type. A cell of the power MOS transistor TP includes a region 9-1, 9-2, formed by dopants of a second conductivity type, for example of the P-type. In each region 9-1, 9-2, are formed two N+-type regions 14 which form the source of the power transistor. The two regions 14 are interconnected by a conductive layer 15 which is, for example, made of aluminum. The lateral edges of regions 9-1, 9-2 form a power transistor channel region 20.

Each cell of the power MOS transistor TP includes a gate 12 formed by a polysilicon layer. Gate 12 is separated from substrate 11 by an oxide layer 13.

The rear surface 17 of substrate 11 includes an overdoped layer 19 coated with a drain metallization 18.

The MOS transistor TL of the logic portion is formed in a P-type well 24. Well 24 includes two N+-type diffusions. The first diffusion forms the source 22 and the second diffusion forms the drain 23 of transistor TL. Transistor TL includes a gate 21 formed by a polysilicon layer. Gate 21 is separated from well 24 by an oxide layer 25. Source 22 and drain 23 are respectively connected to a conductive line referenced 26, 27. Conductive lines 26, 27 are, for example, made of aluminum.

Conventionally, a P+-type area 28 connected to a conductive layer 29 is provided in well 24. Area 28 and the conductive layer 29 connect well 24 to ground.

In normal operation mode, the rear surface metallization 18 is connected to a positive voltage and the front surface metallizations 15 of the power transistor are connected to voltages negative with respect to this positive voltage, for example voltages close to the ground voltage.

The problem to be solved is to prevent the power transistor from becoming conductive due to break down of the junction between substrate 11 and the P-type wells 9-1 and 9-2, i.e. when the drain voltage increases while the transistor is in the off state. Also, it should be noted, in the exemplary integrated circuit including a logic portion, that there is a risk that the junction, between the substrate and the wells in which are disposed the logic components, will break down.

To fabricate a diode capable of breaking down before the junction breaks down between substrate 11 and the wells, the diode can be vertically formed by providing in the N-type substrate a P-type region having a doping level selected so as to have a break down voltage lower than the junction between the substrate and the wells of the power transistors or of the logic portion. However, this would require an additional technological step in order to form this specifically doped P-type region. Despite the complexity of the process, the prior art approaches are directed to this method. However, the implementation of a diode on the front surface of the substrate makes it necessary to convey the high voltage available on the rear surface metallization to the front surface. Such method impairs the distribution of the field lines in the component while this distribution is carefully adjusted to provide the desired maximal breakdown (for example 400 volts, as indicated above).

U.S. Pat. Nos. 4,792,840 and 5,053,743 teach how to form, on the front surface of the substrate a resistor, a terminal of which is connected to the rear surface, the resistor being shaped like a spiral. However, none of these patents suggests that this technology can be extended to provide diodes.

SUMMARY OF THE INVENTION

An object of the invention is to provide an avalanche diode having a predetermined high breakdown threshold and that can be integrated in the same chip as the power transistors without modifying, or by very slightly modifying, the manufacturing method of the integrated circuit including power transistors and the possible control logic circuit associated therewith. The conduction signal from the diode can then be sent to the base or the gate of the power transistor to set it to conduction state again for a selected period or during the overvoltage duration.

In order to achieve these and other objects, the invention provides a high voltage avalanche diode formed in an integrated circuit including at least one vertical power component. The integrated circuit is formed in a semiconductor substrate of a first conductivity type whose rear surface corresponds to a first main electrode of one or several power components. The second main electrodes of one or several power components correspond to one or several regions formed in at least one region of the second conductivity type formed in the front surface of the substrate.

This diode includes a region of the second conductivity type wound substantially as a spiral, formed in the front surface of the substrate; non-overlapping regions of the first conductivity type formed in the spiral in equal number for each turn, forming with the spiral elemental avalanche diodes; metallizations connecting in series the elemental diodes; and a connection between one end of the spiral and the first electrode.

According to an embodiment of the invention, the integrated circuit further includes logic components formed in wells of the second conductivity type formed from the front surface of the substrate.

According to an embodiment of the invention, the above-mentioned connection is formed by a metallization connecting one end of the spiral to an overdoped region of the first conductivity type of the front surface of the substrate.

According to an embodiment of the invention, the above-mentioned connection is formed in the central region of the spiral.

According to an embodiment of the invention, the spiral is interrupted at the vicinity of each area where is formed a region of the first conductivity type.

According to an embodiment of the invention, the metallizations connecting in series the elemental diodes coat spiral portions comprised between two diodes and extend outwardly or inwardly from these portions toward the next turn of the spiral having a lower voltage.

In other words, the invention relates to an avalanche diode formed in a semiconductor structure combining at least one power transistor and one logic or analog portion on a same semiconductor substrate. The power transistor is of the vertical-type and includes a main electrode on the rear surface of the substrate. The diode includes a region of the second conductivity type wound substantially as a spiral, formed in the front surface of the substrate; non-overlapping regions of the first conductivity type formed in the spiral, in equal number for each turn, and forming with the spiral elemental avalanche diodes; metallizations connecting in series the elemental diodes; and a connection between one end of the spiral and the first electrode.

Thus, the invention uses lateral-type avalanche diodes, disposed in series on the front surface. In a power device, lateral diodes with a low voltage (5–20 volts) can be integrated. By way of example, the base-emitter junction of a power bipolar transistor or the source-well junction of a MOS cell can be used. Each diode can have a very small size. By combining several diodes in series, the desired detection voltage can be obtained with accuracy. For example, if it is desired to reach a 380-volt protection voltage, 38 diodes having a 10-volt breakdown voltage are disposed in series.

The foregoing and other objects, features, aspects and advantages of the invention will become apparent from the following detailed description of the present invention when taken in conjunction with the accompanying drawings.

DETAILED DESCRIPTION

Figure 1:
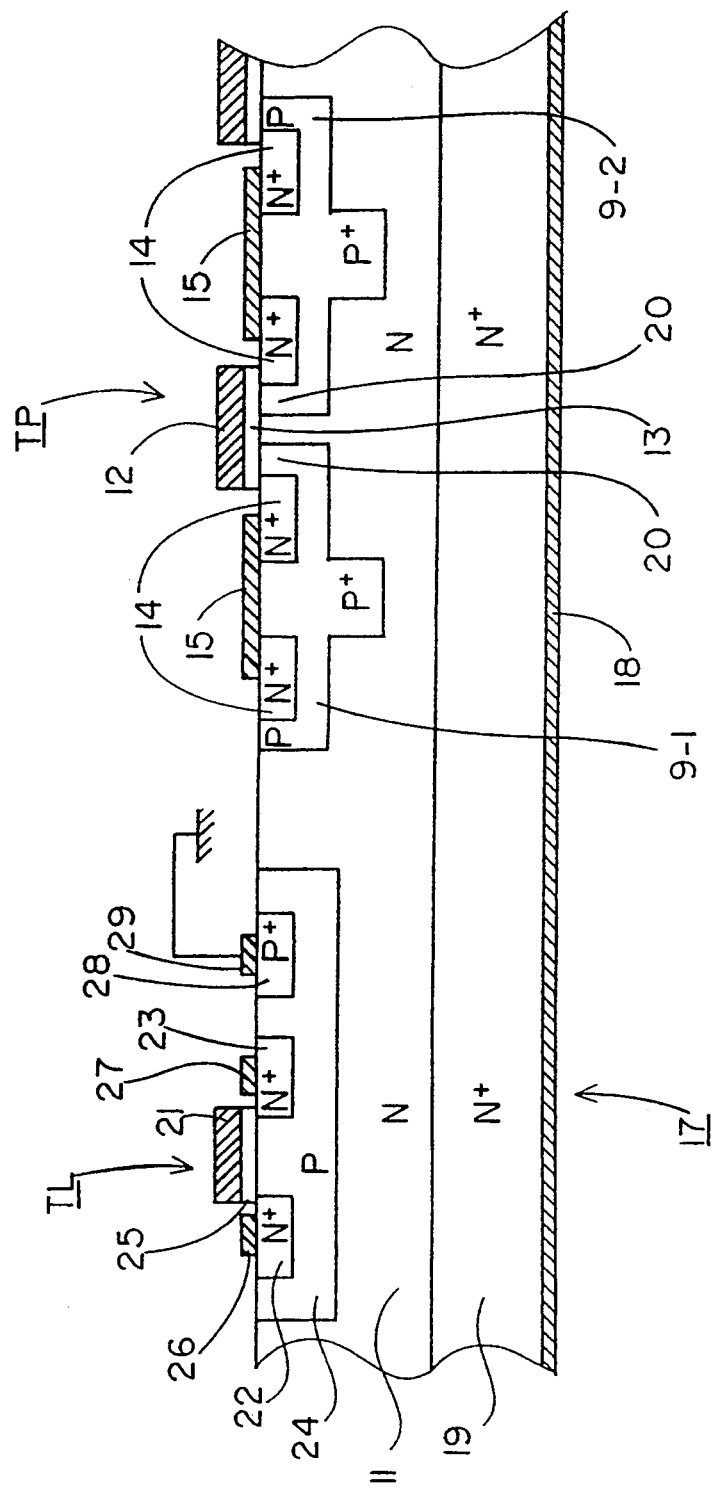
FIG. 1 is an exemplary cross-sectional view of an integrated circuit including a vertical MOS transistor and a logic portion.
Figure 2:
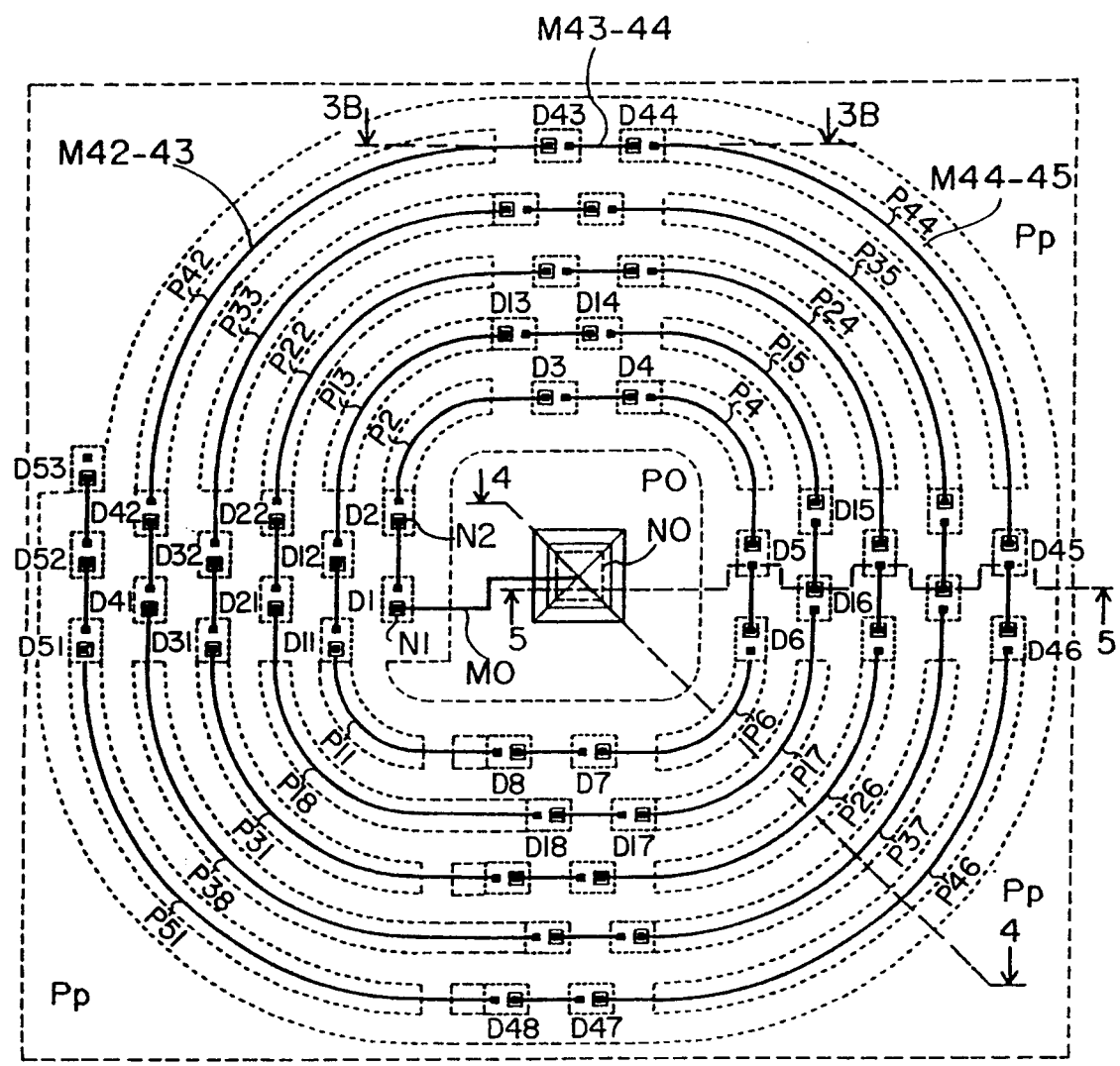
FIG. 2 is a top view of a high voltage avalanche diode according to the invention.

FIG. 2 is an exemplary embodiment of a spiral-type avalanche diode according to the invention. This top view shows only a portion of an integrated circuit chip, the other portions of which are, for example, portions illustrated in FIG. 1.

FIG. 2 is a top view of an avalanche diode according to the invention at an intermediate manufacturing step when the metallizations have not yet been formed. FIG. 2 shows a P well including a central portion P0 and a spiral portion extending to a peripheral region Pp. In the embodiment represented, each turn of the spiral includes substantially linear horizontal and vertical portions, and is interrupted in the vicinity of the linear portions. The central region of portion P0 includes an N-type diffused region N0 that contacts the substrate and, therefore, is connected to the voltage of the rear surface metallization. The peripheral region Pp is normally connected to the low reference voltage.

Along each turn of the spiral are disposed N-type regions in order to form successive diodes. In the embodiment represented, the spiral includes slightly more than five turns. The first turn includes diodes D1–D8, the second turn includes diodes D11–D18, the third turn includes diodes D21–D28, the fourth turn diodes D31–D38, the fifth turn includes diodes D41–D48 and the portion of the last turn includes diodes D51, D52 and D53. Each diode is connected to the next one by a metallization M schematically represented by a line in FIG. 2.

Thus, the successive turns of the spiral are at progressively decreasing potentials, which allows, as in the case of spiral resistors disclosed in the above-mentioned U.S. patents, to extend the distribution of the field lines. Thus, abrupt voltage transitions within adjacent points of the component surface, and therefore an undesired decrease in its breakdown voltage, are avoided.

Figure 3A:
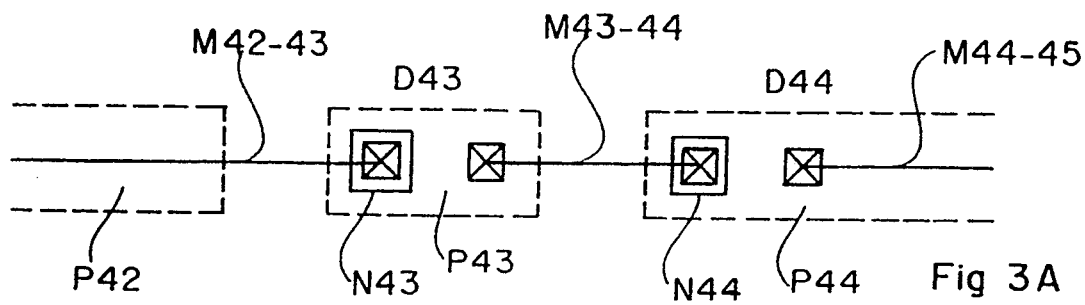
FIG. 3A is an enlarged top view corresponding to the partial cross-sectional view of FIG. 3B.
Figure 3B:
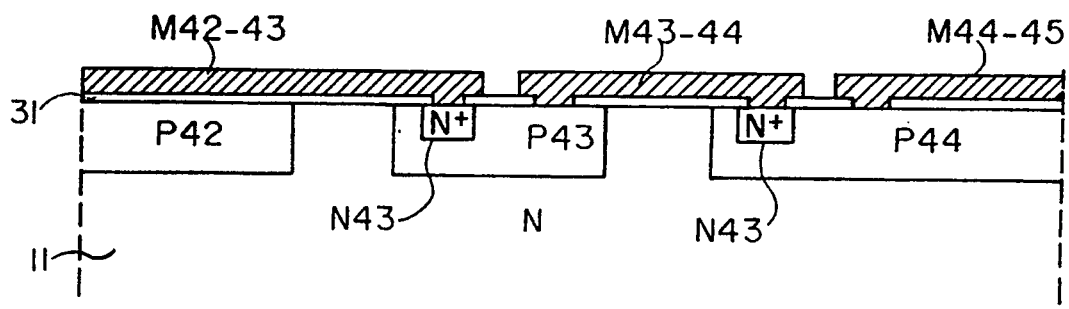
FIG. 3B is a cross-sectional view along line 3B—3B of FIG. 2.
Figure 4:
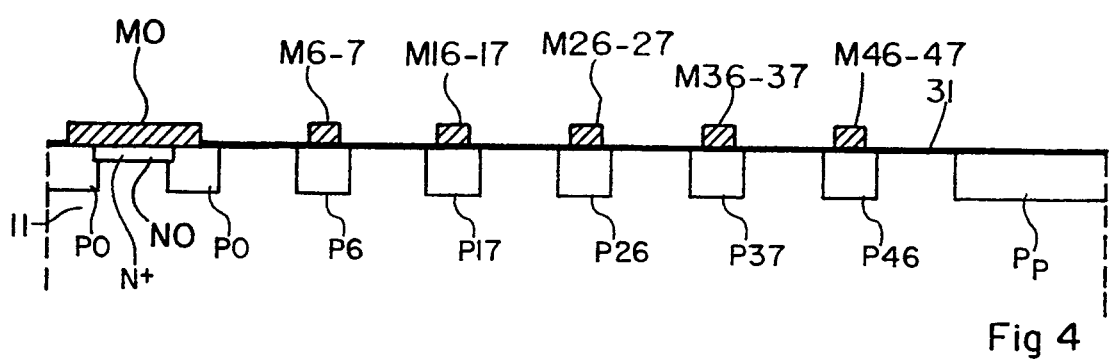
FIG. 4 is a cross-sectional view along line 4—4 of FIG. 2.
Figure 5:
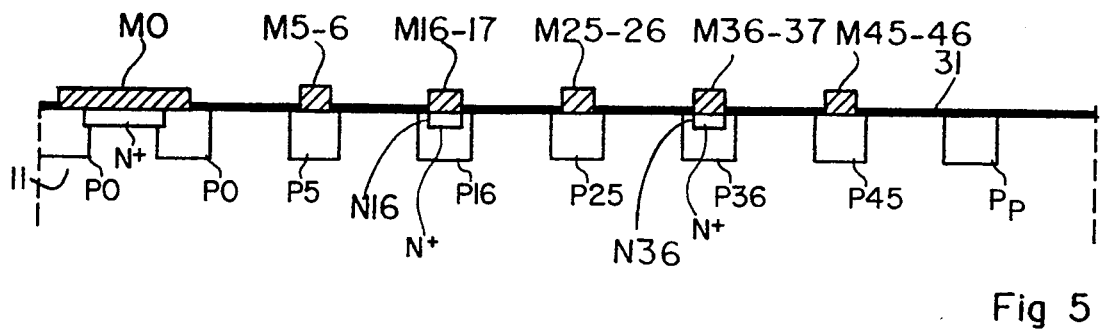
FIG. 5 is a cross-sectional view along line 5—5 of FIG. 2.

The structure according to the invention will be better understood by considering FIGS. 3, 4 and 5.

FIG. 3 includes FIGS. 3A and 3B. FIG. 3B shows a partial cross-sectional view along line 3B—3B of FIG. 2, and FIG. 3A is a corresponding top view. FIG. 3A shows diodes D43 and D44. Diode D43 is formed in a portion P43 of the P-type spiral well and includes an N-type region N43. The structure surface is coated with an insulating layer 31, conventionally an oxide layer, except at places where contacts marked with a cross in FIG. 3A are provided. Thus, a contact on region N43 and a contact on region P43 are established. The contact on region N43 is connected by a metallization M42-43, symbolically represented by a line in FIG. 3A, to the contact on region P42 of the preceding diode D42. The contact on region P43 is connected through a metallization M43-44 to the contact on region N44 of the next diode D44. The spiral well is formed in a substrate which corresponds, for example, to a portion of the substrate 11 illustrated in FIG. 2.

FIG. 4 is a schematic cross-sectional view along line 4—4 of FIG. 2. On the left-hand portion of FIG. 4 is shown the cross-sectional view of the central portion including the region N0 contacting substrate 11 and surrounded by region P0. Regions N0 and P0 are contacted by a metallization M0 which contacts, as symbolically shown in FIG. 2, the contact on region N1 of diode D1. The cross-sectional views also show the successive regions P6, P17, P26, P37, P46 and Pp, all of them coated with insulating layer 31 since they are outside the contacting areas. Region P6 is coated with metallization M6–7, region P17 is coated with metallization M16–17, region P26 is coated with metallization M26–27, region P37 with metallization M36–37 and region P46 with metallization M46–M47.

FIG. 5 is a cross-sectional view along the broken line 5—5 of FIG. 2. Line 5—5 is broken in order to pass through contacting regions between a metallization and the underlying layer. The left-hand portion of FIG. 5 is similar to the left-hand portion of FIG. 4. Then, are disposed P-type regions P5, P76, P25, P36, P45 and, lastly, Pp. In regions P16 and P36 are formed N-type regions, N16 and N36, respectively. A contact with regions P5, N16, P25, N36 and P45 is established through respective metallizations M5–6, M16–17, M25–26, M36–37, M45–46.

The description of FIGS. 3–5 is useful for understanding the top view of FIG. 2 in which the same references are used as in FIGS. 3–5.

In FIG. 2, the P-type regions of the spiral are interrupted at various places, in the vicinity of the areas where are formed N-type regions in order to more efficiently separate the various elemental diodes. However, the P-type spiral can be uninterrupted; hence, each diode would be in parallel with a high value resistor. Indeed, the P-type region has a relatively low doping level and its resistance per square is non negligible. Thus, the serial diodes according to the invention would have a parallel resistance and therefore a slight current leakage; however, this would not impair the fundamental operation of the circuit.

Also, it should be noted, considering FIG. 2, that the places where spiral P is interrupted are selected so as not to be aligned along a radial axis. The aim of this arrangement is to ensure a better distribution of voltages and to avoid phenomena associated with an excessive curvature of the field lines when a high voltage is applied between the front and rear surfaces. Although not represented in FIG. 2, the last diode D53 has its P contact region connected to the low voltage of the structure, for example to the gate or base terminal of the power transistor to be protected against forward overvoltages by the diode.

Figure 6:
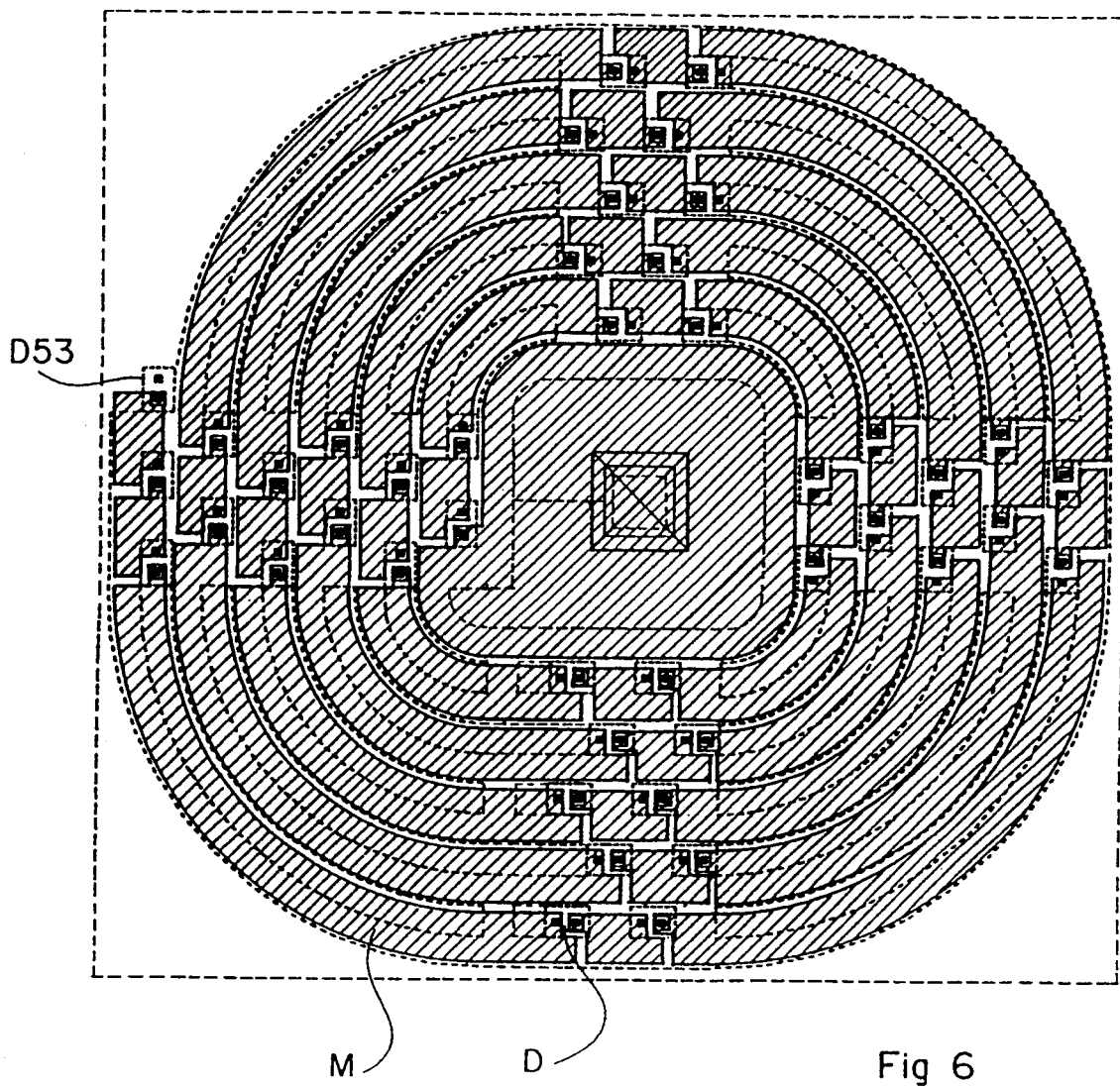
FIG. 6 is a top view of a diode, according to the invention, coated with metallizations.

FIG. 6 is a top view corresponding to the top view of FIG. 2 but in which the various metallizations are indicated. It should be noted that each metallization connecting two successive diodes of the spiral overlaps outwardly with respect to each P-type region that it covers to have a field plate function, further improving the distribution of the voltages. Although not represented in FIG. 6, the last contact of diode D53 is connected through a metallization in the way above described in connection with FIG. 2. FIG. 6 is readily understood by referring to the previous figures and does not indicate any references, except the general references M to designate a metallization, D to designate a diode, and D53 to designate the last diode of the spiral.

As is apparent to those skilled in the art, various modifications can be made to the above-described embodiment.

More particularly, as indicated above, the diode according to the invention is not necessarily used with a structure of the type illustrated in FIG. 1 but can be used with other structures including vertical power components.

Means other than a central contact N+ can be used to ensure conduction between the rear surface and the front surface of the substrate. A specific connection at the center of the spiral can also be provided.

The contacts on various points of the P-type spiral to form an electrode of the various diodes are preferably formed on an overdoped region of the spiral to improve the ohmicity of the contacts.

Additionally, there has been represented and described with reference to the various drawings a spiral closed about a central portion on which the high voltage is provided. Also, the spiral according to the invention could surround the assembly of the integrated circuit chip, components such as vertical power transistors and the various logic components being formed in the central portion of the integrated circuit. In this case, it is the external portion of the spiral that is set to the voltage of the rear surface metallization.

Although specific embodiments of the invention have been described in relation to vertical MOS transistors corresponding to a specific manufacturing technology, the invention more generally relates to numerous other technologies including a vertical power component. The vertical power component can be of the bipolar-type. The power component can be connected to logic circuits formed in various ways, for example, on an insulating material or in combination with buried layers.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A high voltage avalanche diode formed in an integrated circuit including at least one vertical power component, the integrated circuit being made in a semiconductor substrate of a first conductivity type having a rear surface contact that corresponds to a first main electrode of the power component, at least one contact region formed in at least one region of a second conductivity type formed in a front surface of the substrate that corresponds to a second main electrode, said diode including:

a region of the second conductivity type wound substantially as a spiral, formed in the front surface of the substrate;

non-overlapping regions of the first conductivity type formed in the spiral in equal number per turn and forming elemental avalanche diodes with the spiral;

metallizations connecting the elemental diodes in series; and a connection between an extremity of the spiral and the first electrode.

2. The high voltage avalanche diode of claim 1, wherein the integrated circuit further includes wells of the second conductivity type formed from the front surface of the substrate and logic circuits formed in said wells.

3. The high voltage avalanche diode of claim 1, wherein the connection is formed by a metallization connecting an extremity of the spiral to an overdoped region of the first conductivity type of the front surface of the substrate.

4. The high voltage avalanche diode of claim 1, wherein the connection is made in a central region of the spiral.

5. The high voltage avalanche diode of claim 4, wherein the spiral is interrupted near each area where is formed a region of the first conductivity type.

6. The high voltage avalanche diode of claim 1, wherein the metallizations that serially connect the elemental diodes overlie the portions of the spiral comprised between two diodes and extend outwardly from the portion toward a next spiral turn having a lower voltage.

7. The high voltage avalanche diode of claim 1, wherein the metallizations that serially connect to the elemental diodes overlie the portions of the spiral comprised between two diodes and extend inwardly from the portion toward a next spiral turn having a lower voltage.

8. An avalanche diode formed in a semiconductor structure combining at least one power transistor and one logic or analog portion on a same semiconductor substrate, the power transistor being of the vertical type and including a main electrode on a rear surface of the substrate, wherein the diode includes:

a region of a second conductivity type wound substantially as a spiral, formed in the rear surface of the substrate;

interrupting regions of the first conductivity type formed in the spiral in equal number for each turn and forming elemental avalanche diodes with the spiral;

metallizations serially connecting the elemental diodes; and a connection between an extremity of the spiral and the first electrode.

9. The avalanche diode of claim 8, wherein the connection between an extremity of the spiral and the first electrode is formed by a metallization connecting an extremity of the spiral to an overdoped region of a first conductivity type of a front surface of the substrate.

10. The avalanche diode of claim 9, wherein the connection is made in a central region of the spiral.

11. The avalanche diode of claim 10, wherein the interrupted regions are regions of the first conductivity type.

12. The avalanche diode of claim 11, wherein the metallizations that serially connect the elemental diodes overlie the portions of the spiral comprised between two diodes and extend outwardly from the portion toward a next spiral turn having a lower voltage.

13. The avalanche diode of claim 11, wherein the metallizations that serially connect the elemental diodes overlie portions of the spiral comprised between two diodes and extend inwardly from the portion toward a next spiral turn having a lower voltage.

* * * * *